United States Patent [19]
Huang

[11] Patent Number: 5,946,569
[45] Date of Patent: *Aug. 31, 1999

[54] DRAM CONTACT PROCESS BY LOCALIZED ETCH-STOP REMOVAL

[75] Inventor: Julie Huang, Hsin-chu, Taiwan

[73] Assignee: Taiwan Semiconductor Manufacturing Company, Ltd., Hsin-Chu, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 08/755,871

[22] Filed: Dec. 2, 1996

[51] Int. Cl.$^6$ ...................................................... H01L 21/70
[52] U.S. Cl. .......................... 438/253; 438/210; 438/296; 438/634; 438/660; 438/722; 438/724; 438/740; 438/763; 438/787; 438/791; 438/970
[58] Field of Search ..................................... 438/634, 740, 438/970, 210, 253, 396, 660, 780, FOR 212, FOR 207, FOR 220, FOR 407, FOR 431, FOR 489, 296, 722, 724, 763, 787, 791; 216/72, 67; 148/DIG. 14, DIG. 156

[56] References Cited

U.S. PATENT DOCUMENTS

| | | | |
|---|---|---|---|
| 4,966,870 | 10/1990 | Barber et al. | 438/740 |
| 5,219,793 | 6/1993 | Cooper et al. | 438/634 |
| 5,292,677 | 3/1994 | Dennison | 438/396 |
| 5,438,009 | 8/1995 | Yang et al. | 438/253 |
| 5,464,785 | 11/1995 | Hong | 438/264 |
| 5,550,078 | 8/1996 | Sung | 438/210 |
| 5,619,052 | 4/1997 | Chang et al. | 257/321 |
| 5,706,164 | 1/1998 | Jeng | 438/253 |

*Primary Examiner*—Bernard Codd
*Attorney, Agent, or Firm*—George O. Saile; Stephen B. Ackerman

[57] ABSTRACT

A method of removing an etch-stop layer such as $Si_3N_4$ from the vicinity of contact openings is described. A need for the removal of this material arises when the surface of the etch-stop layer is exposed during processing and the substrate is subjected to temperatures above 700° C. Because of the high intrinsic interfacial stress residing in the $Si_3N_4$, the thermal impact causes cracks in the layer which emanate from the corners of the contact openings and travel, with branching, over a considerable distance from the opening. These cracks are prone to moisture adsorption and contamination which can compromise the reliability and performance of contacts. In addition, where contact openings are formed through insulating layers having an intermediate etch-stop layer, protrusions of the etch-stop layer occur within the contact opening because of un-even etching. These protrusions shadow the flux of subsequently deposited barrier materials into the opening, thereby forming weak spots along the contact walls. Timely removal the etch-stop layer around the contact opening eliminates these protrusions.

5 Claims, 9 Drawing Sheets

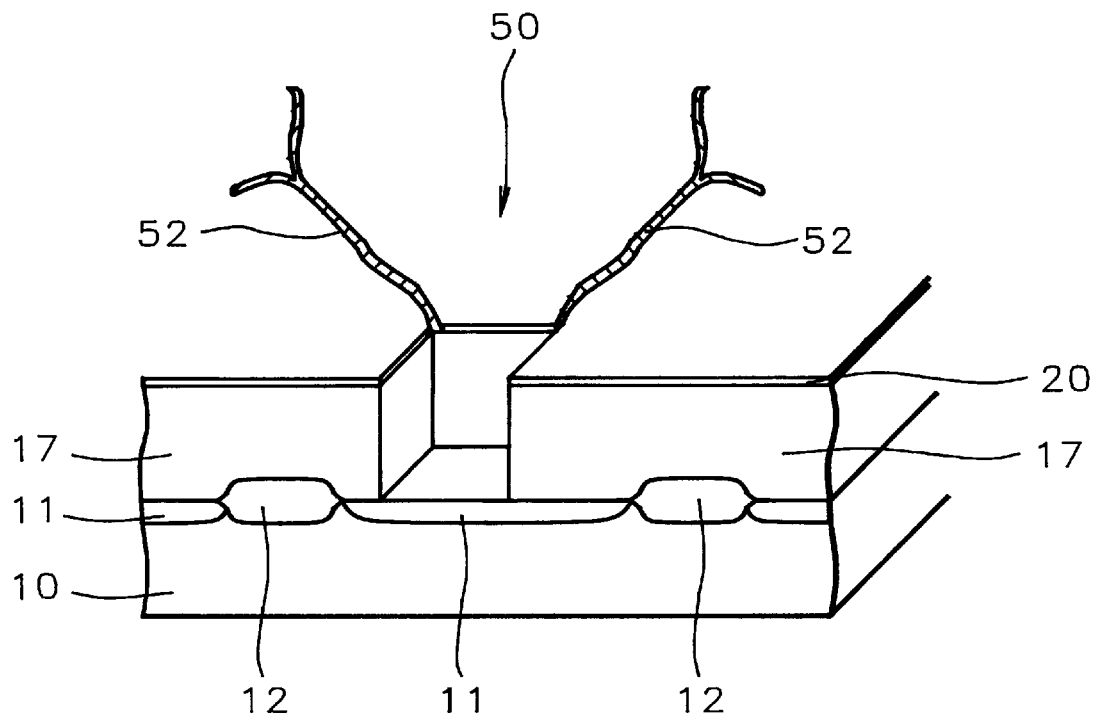
FIG. 1 – Prior Art
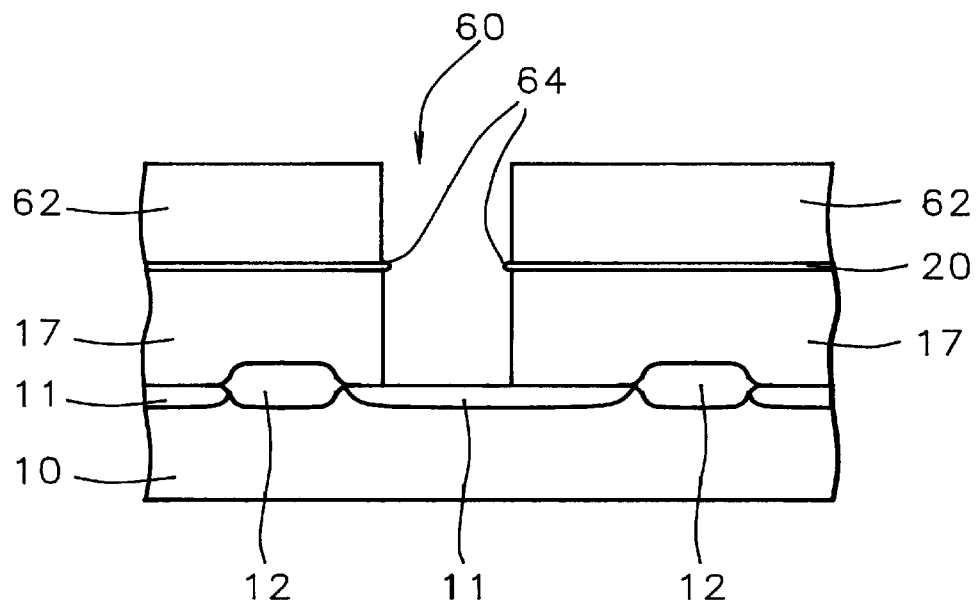
FIG. 2 – Prior Art

DRAM CONTACT PROCESS BY LOCALIZED ETCH-STOP REMOVAL

BACKGROUND OF THE INVENTION (1) Field of the Invention

The invention relates to processes for the manufacture of semiconductor devices and more particularly to processes for forming DRAMs.

(2) Description of Prior Art

Computer memory consists of vast arrays of storage cells which can be addressed by wordlines and bitlines. The most commonly used cell design used in current dynamic-random-access-memories(DRAMs) comprises a transfer gate, usually an MOS field-effect-transistor(MOSFET), and a storage node consisting of a capacitor. DRAM cells are, by necessity of high density requirements, of the simplest design possible and to this end, the MOSFET-capacitor combination serves quite well.

In order to maintain a sufficiently high capacitance of the storage capacitor in wake of constantly shrinking cell size, many variations of the cell configuration have evolved. These include contorting the capacitor within the confines of the cell in order to maintain a sufficient plate area. The stacked capacitor(STC) configuration is most commonly used. One design for this capacitor comprises a cylindrical structure having a narrow structure beginning at a contact to a transistor drain and, after rising above the level wherein bitlines and wordlines are located, enlarging to cover nearly the entire area of the cell.

In order to form the opening of this structure an etch-stop layer is required at the level where the storage plate enlarges. The function of the etch-stop layer will become clear as the embodiments of this invention are described. Typically this is a $Si_3N_4$ layer between about 200 Å and 1,500 Å thick.

After the polysilicon storage plate of the stacked capacitor has been formed, the wafer is subjected to temperatures of about 700° C. in order to form the capacitor dielectric. The dielectric commonly used is a composite layer of $SiO_2/Si_3N_4/SiO_2$, referred to simply as ONO. During this thermal exposure, the $Si_3N_4$ etch-stop layer over the surface surrounding contact openings is exposed. These openings are found primarily in the peripheral circuits of the DRAM. The high temperature during the ONO processing causes the $Si_3N_4$ layer, which is under tensile stress, to crack at these openings. The cracks emanate from the corners of the openings and spread over a large area of the wafer, branching as well. FIG. 1 shows an angled cross section of a contact opening 50 in the periphery of a DRAM integrated circuit on wafer 10. The opening is made to an active area 11 through a $Si_3N_4$ etch-stop layer 20 and an insulative layer 17. The wafer has been subjected to a thermal stress of 700° C. to form an ONO dielectric layer in the cell array of the DRAM. Long branching cracks 52 are formed in the $Si_3N_4$, emanating from the corners of the opening 50 and extending great distances across the wafer surface. These cracks 52 are prone to harbor adsorbed moisture and sundry contaminants, leading to reliability problems.

In regions where the $Si_3N_4$ layer is not exposed during the ONO formation cracks do not occur. However, the subsequent formation of contact openings 60 through the $Si_3N_4$ etch-stop layer 20 as shown in FIG. 2, present an additional problem.

An interlevel dielectric layer 62 has been deposited over the nitride layer 20 and a contact opening 60 has been etched through to the silicon active area 11. Because of the etch resistance of the $Si_3N_4$ layer, fragmented projections 64 remain in the contact opening 60. These projections 64 shadow the opening wall just below them from subsequent barrier metal deposition producing a weakened contact.

Dennison U.S. Pat. No. 5,292,677 utilizes an $Al_2O_3$ etch-stop layer deposited over a silicon oxide layer. The capacitor and the peripheral contacts are opened at the same time using the etch-stop layer. The exposed layer is then removed from all the openings. Dennison does not use a buried bit line as does the cell addressed by this invention. The etch-stop layer used by Dennison is at a lower level and is not used in the same way as in this invention. In Dennison, the storage poly is deposited into both the capacitor and the contact openings as in the process of this invention.

By using a timed etch, Dennison leaves insulator over the surface adjacent to the contact openings, covering the etch-stop layer. However, as will become apparent in the description of the embodiments, the process of this invention utilizes the $Si_3N_4$ etch-stop layer a second time to halt the wet etch which exposes the completed storage poly plates. This leaves un-covered $Si_3N_4$ adjacent to the contact openings which cracks during the ONO deposition.

Hong U.S. Pat. No. 5,464,785 shows the use of $Si_3N_4$ as a sacrificial layer in the manufacture of an EPROM having ONO. However the $Si_3N_4$ is deposited after the ONO is formed and is not subjected to high temperature.

SUMMARY OF THE INVENTION

It is an object of this invention to describe a method for eliminating the formation of cracks in exposed $Si_3N_4$ etch-stop layer at contact openings during the formation of the ONO capacitor dielectric in the manufacture of DRAMs.

Another object of this invention is to disclose a method for eliminating the problem of barrier metal shadowing by $Si_3N_4$ protrusions in the peripheral contact openings of DRAMs.

These objects are achieved by selectively removing exposed etch-stop layer prior to ONO formation. Photoresist is applied over the wafer and the array or cell areas of the DRAM chip are protected using a block-out mask. The exposed $Si_3N_4$ etch-stop layer in the peripheral regions is then removed by plasma etching.

BRIEF DESCRIPTION OF THE DRAWINGS

FIG. 1 is an angled top view of a prior art structure with a cross section showing cracks formed in a $Si_3N_4$ etch-stop layer at a contact opening.

FIG. 2 is a cross sectional view of a prior art contact opening having $Si_3N_4$ protrusions along the walls.

DESCRIPTION OF THE PREFERRED EMBODIMENTS

Figure 3:
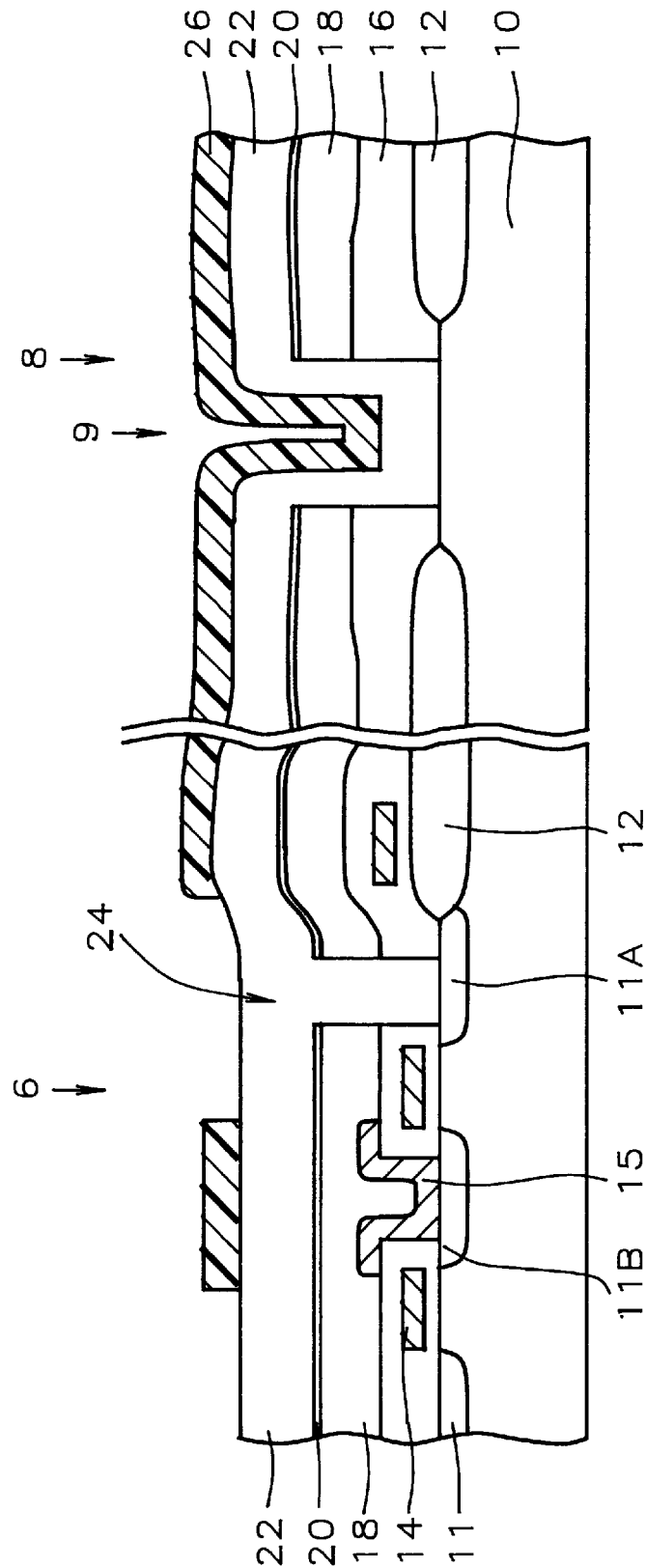
FIG. 3 through FIG. 10 are cross sectional views showing DRAM processing in the region of a STC DRAM cell and at a contact opening in the peripheral circuitry, illustrating the function of a $Si_3N_4$ etch-stop layer and its subsequent disposition according to this invention.

Accordingly, a preferred embodiment of this invention is hereby described. Referring to FIG. 3 a p-doped <100> oriented monocrystalline silicon wafer 10 is provided. The wafer is processed using the conventional DRAM manufacturing procedures to the point where n-channel MOSFET devices with active areas 11, 11A and 11B have been formed within the wafer surface by well known implantation techniques. Self-aligned polysilicon gates 14 have been provided which form the DRAM-word lines. The section 6 in FIG. 3 is in the array or cell portion of the DRAM chip while the section 8 is in the peripheral portion which contains the array support circuitry and includes the contact opening 9. A first inter-polysilicon insulating layer(IPO)16 has been deposited and polysilicon bit lines 15 have been formed, contacting the active area 11B through openings in this layer. A second IPO 18 is deposited over the wafer and planarized by chemical-mechanical-polishing(CMP). A $Si_3N_4$ etch-stop layer 20 is then formed over the IPO 18. The etch-stop layer 20 is preferably deposited by low-pressure-chemical-vapor-deposition(LPCVD) at a temperature of between about 650° C. and 800° C. Alternately, $Al_2O_3$ may be substituted for $Si_3N_4$ to form the etch stop layer 20. The layer 20 is between about 200 and 2,000 Å thick. An opening 24 is made through layer 20 and the subjacent IPO layers 16 and 18 to expose the active region 11A. This begins the formation of the storage plate of the cell capacitor. The larger contact opening 9 in the periphery is also formed.

A third IPO 22 is deposited and a photoresist mask 26 is patterned to define the enlarged upper portion of the storage plate. Using reactive-ion-etching, the IPO layer 22 is etched, halting at the etch-stop layer 20 everywhere except at the opening 24 where the insulator is removed to expose the active region 11A.

Figure 4:
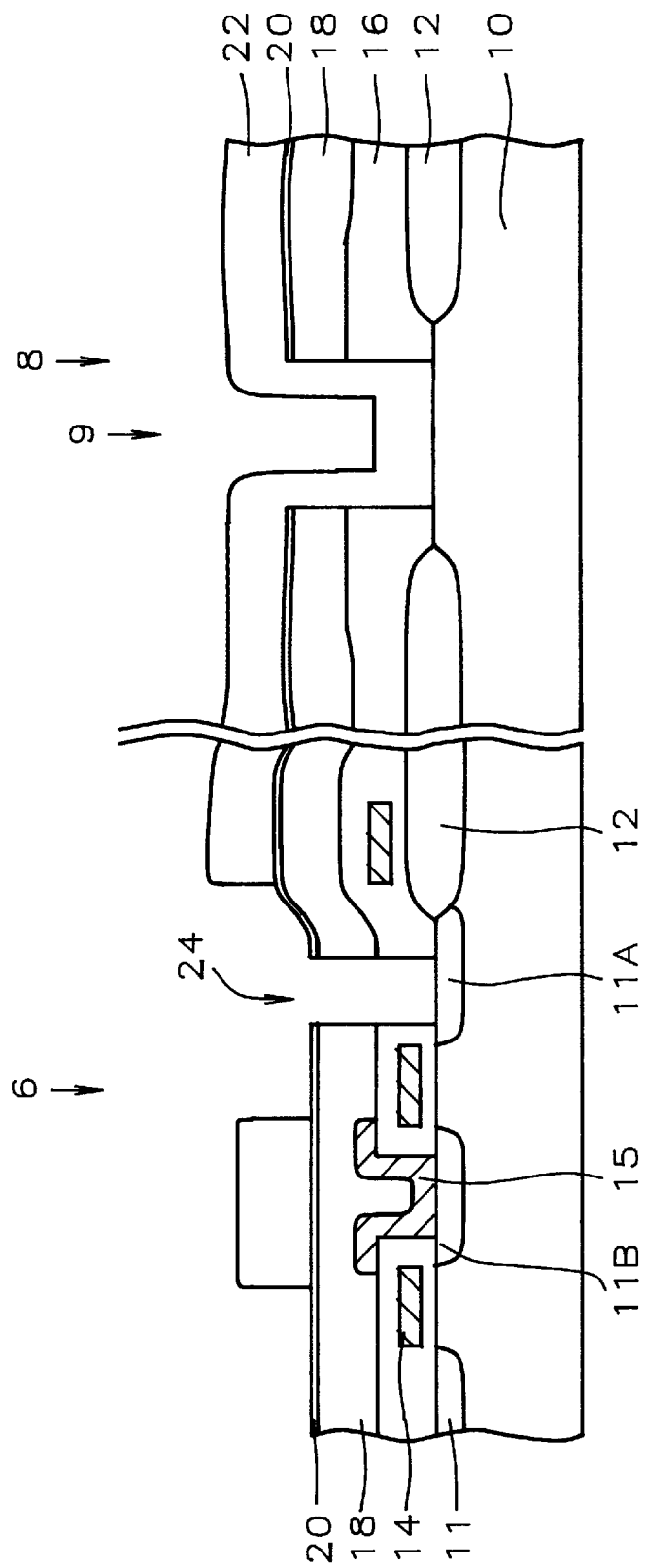
Figure 5:
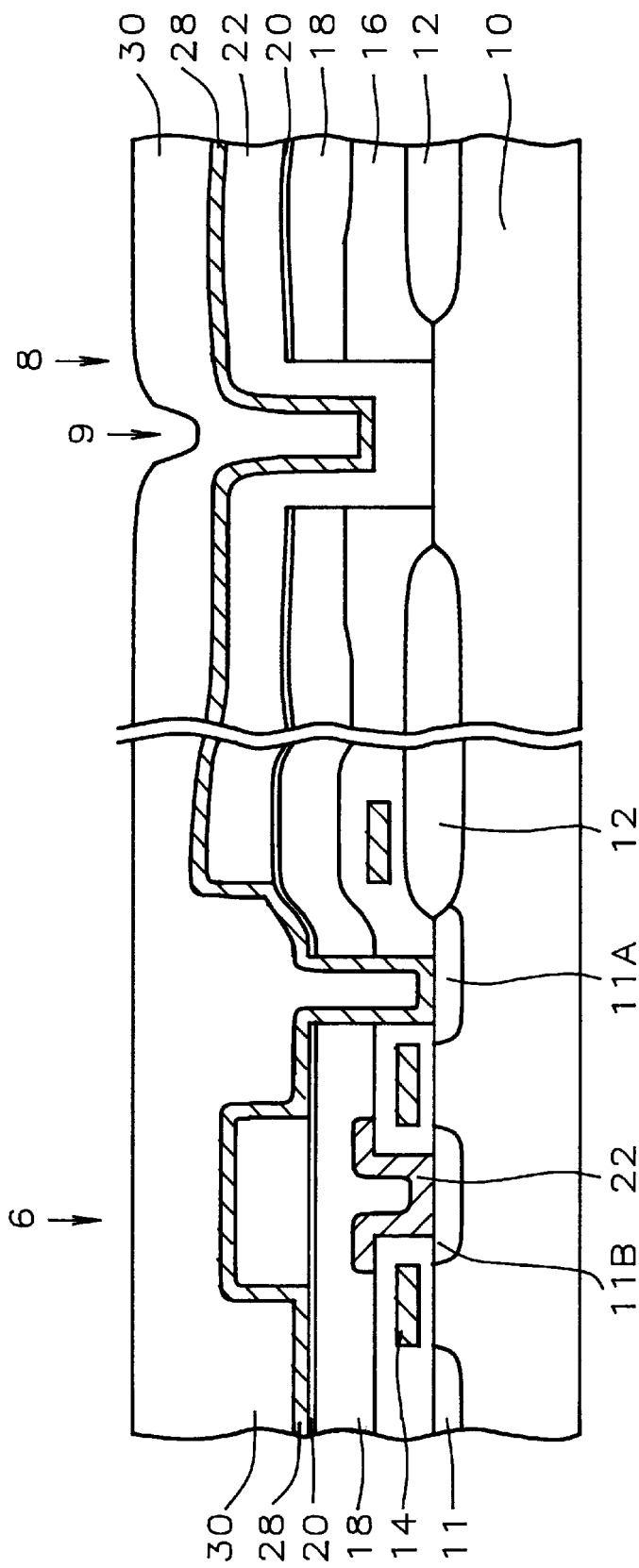
Figure 6:
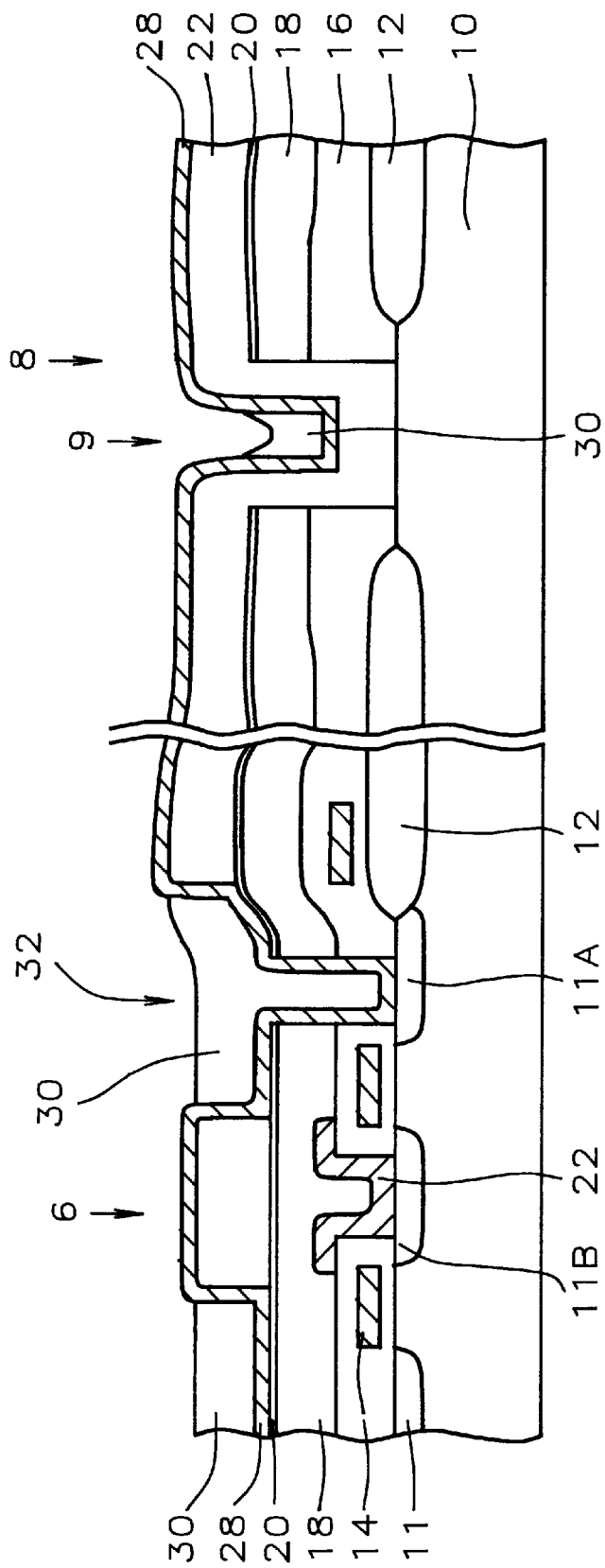
Figure 7:
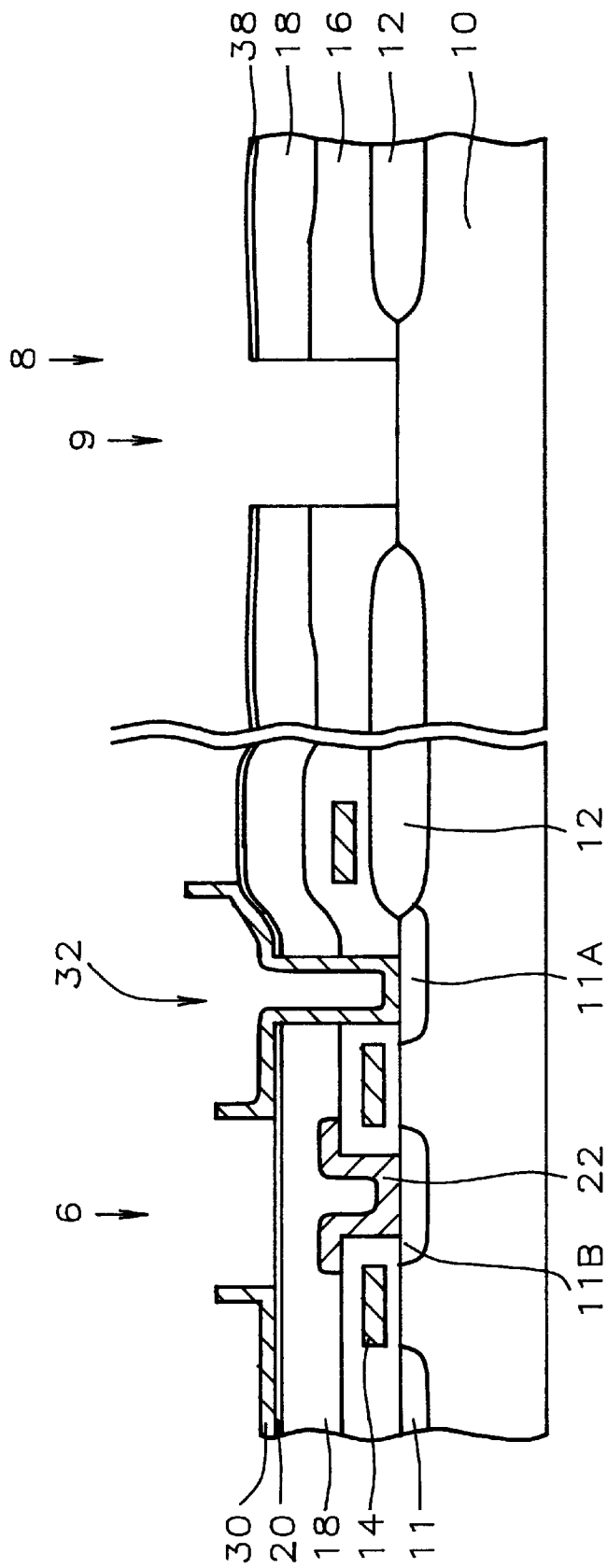

FIG. 4 shows the resultant opening 24 after the photoresist 26 is removed. Referring now to FIG. 5, a layer of doped polysilicon 28 is deposited followed by a fourth IPO layer 30. The fourth IPO layer 30 is then etched until the upper portions of the polysilicon layer 28 are exposed as shown if FIG. 6. The exposed polysilicon is then removed by plasma etching and the remainder of the fourth IPO layer 30 is removed by a 10:1 buffered HF dip. FIG. 7 shows the completed storage plate 32.

Figure 8:
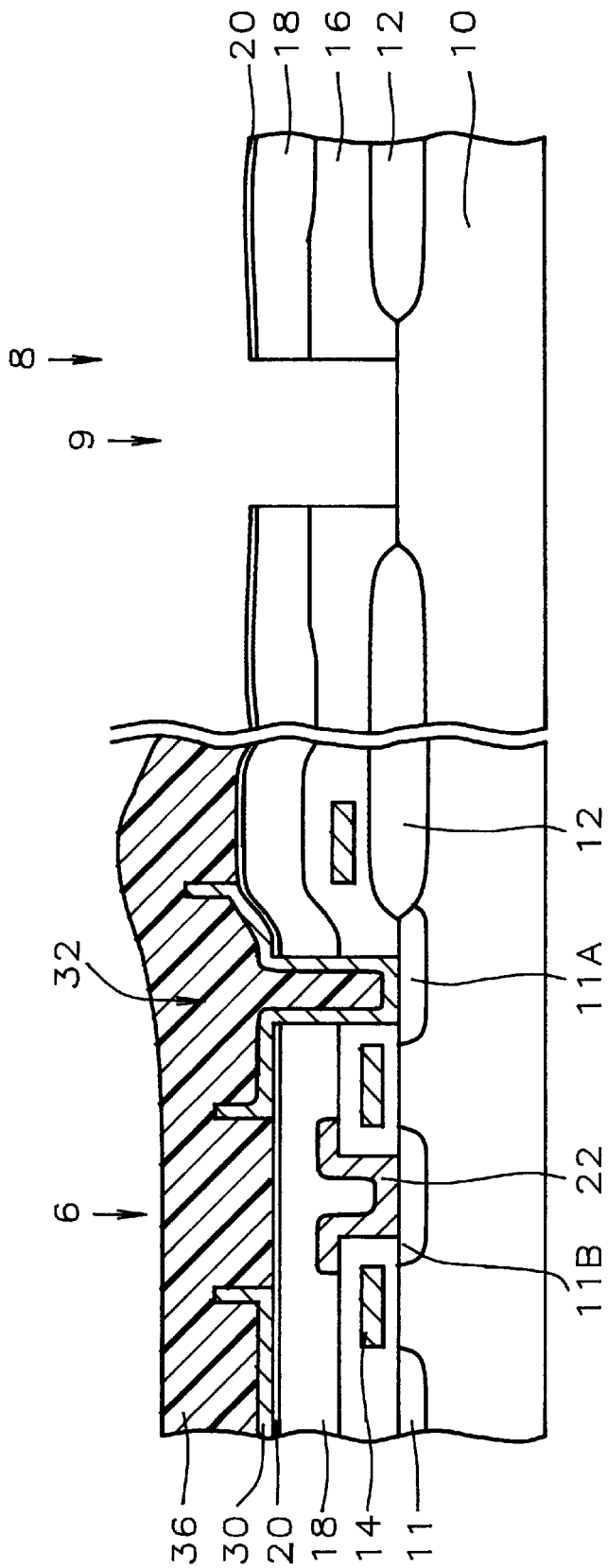

Referring now to FIG. 8, in a key step of the invention, a layer of photoresist 36 is applied over the wafer, in contact with the etch stop layer 20 as shown in FIG. 8 and patterned to form a block-out mask which covers the array or cell portion 6 of the DRAM chip. The exposed $Si_3N_4$ etch-stop layer 20 in the peripheral portion 8 of the DRAM chip is removed by plasma etching. The photoresist layer 36 is then stripped.

Figure 9:
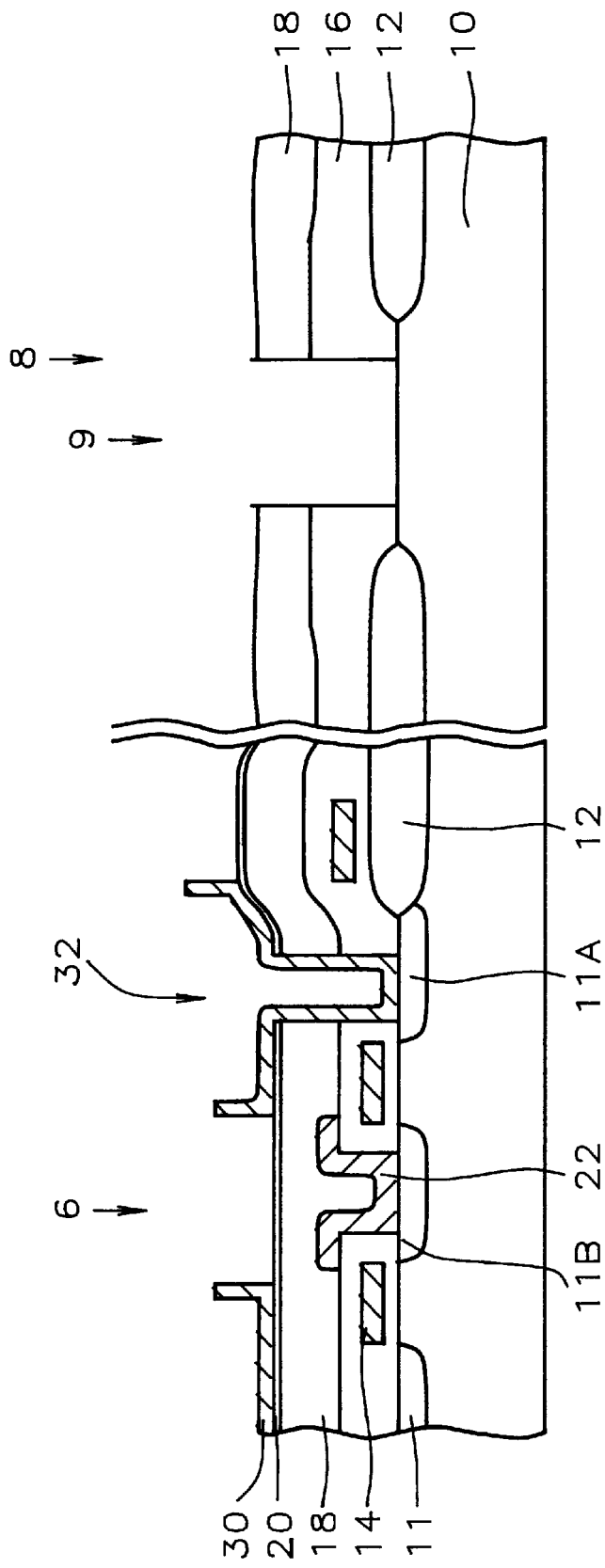

FIG. 9 shows the cross section after the photoresist 36 has been removed. The contact opening 9 in the DRAM peripheral circuitry 8, having had exposed $Si_3N_4$ removed by the selective etch step, is no longer subject to the cracking problem.

Figure 10:
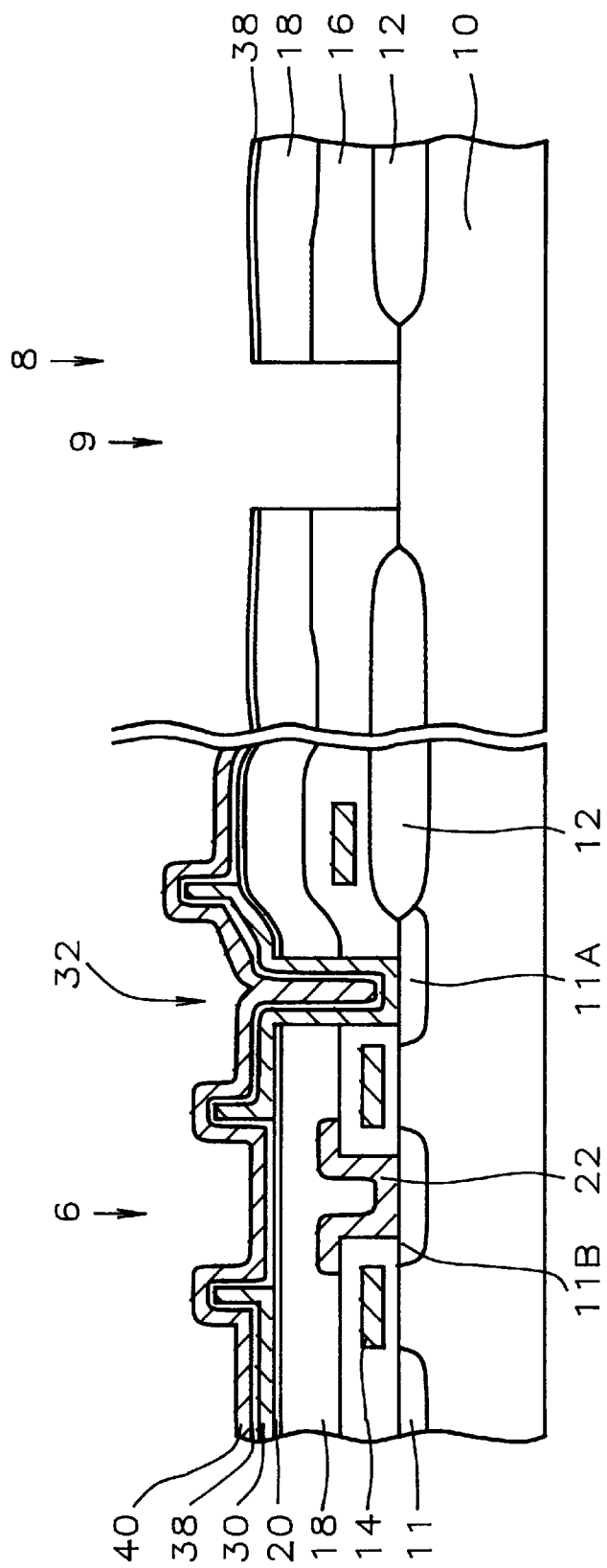

Referring now to FIG. 10 the capacitor composite dielectric ONO 38 is deposited. Processing for the formation of ONO requires subjecting the wafer to temperatures of about 700° C. The capacitor is completed by the deposition of a layer of doped polysilicon 40 which forms the cell plate. The cell plate is then patterned, an interlevel-dielectric layer(not shown) is formed over it and processing of the DRAM proceeds with the formation of the wiring metallization. FIG. 10 shows the cross section after cell plate patterning step.

The key features of the invention, which are illustrated in the foregoing embodiment, consist of a method for preventing the formation of cracks in an etch-stop layer next to contact openings during the deposition of an ONO layer in a DRAM process. The method comprises providing a wafer having an etch-stop layer with an exposed planar surface next to contact openings and a terminating edge of the etch stop layer at the contact openings as shown in the peripheral region 8 of FIG. 7 and FIG. 8; patterning a photoresist layer on the etch-stop layer to expose areas of the etch stop layer at the edges of contact openings and etching away the etch stop layer in these areas. The ONO deposition is then performed without the formation of cracks.

The embodiment described uses a p-type silicon wafer. It should be well understood by those skilled in the art that n-type substrate conductivities may also be used. It should be further understood that the substrate conductivity type as referred to here does not necessarily refer to the conductivity of the starting wafer but could also be the conductivity of a diffused region within a wafer wherein the semiconductor devices are incorporated. Such situations are encountered twin-well CMOS technology.

While the invention has been particularly shown and described with reference to the preferred embodiments thereof, it will be understood by those skilled in the art that various changes in form and details may be made without departing from the spirit and scope of the invention.

What is claimed is:

1. A method for preventing the formation of cracks in an etch-stop layer next to contact openings during the formation of an $SiO_2/Si_3N_4/SiO_2$ capacitor dielectric comprising:

(a) providing a wafer having an etch-stop layer with an exposed planar surface next to contact openings and wherein said etch stop layer is does not extend into said contact openings;

(b) depositing a photoresist layer in contact with said etch-stop layer;

(c) patterning said photoresist layer to expose an area of said etch-stop layer next to said contact openings;

(d) etching said area of etch-stop layer; and (e) after step (d), forming an $SiO_2/Si_3N_4/SiO_2$ dielectric layer on said wafer whereby said wafer is subjected to a temperature of 700° C. or thereabout.

2. The method of claim 1 wherein said etch-stop layer is taken from the group consisting of $Si_3N_4$ and $Al_2O_3$.

3. The method of claim 2 wherein said etch-stop layer is deposited by low-pressure-chemical-vapor-deposition at a temperature of between about 650° C. and 800° C.

4. The method of claim 2 wherein said etching is plasma etching.

5. The method of claim 1 wherein said etch-stop layer is between about 200 and 2,000 Angstroms thick.

* * * * *